United States Patent [19]
Isobe

[11] Patent Number: 5,163,074
[45] Date of Patent: Nov. 10, 1992

[54] DYNAMIC FREQUENCY DIVIDER CIRCUIT WITH CAPACITOR IN LOOP TO ACHIEVE FIFTY PERCENT DUTY CYCLE OUTPUT

[75] Inventor: Masaya Isobe, Tenri, Japan
[73] Assignee: Sharp Kabushiki Kaisha, Osaka, Japan
[21] Appl. No.: 697,302
[22] Filed: May 7, 1991
[30] Foreign Application Priority Data
 May 9, 1990 [JP] Japan .................... 2-120791
[51] Int. Cl.[5] ............................. H03K 23/44
[52] U.S. Cl. ............................. 377/117; 377/105; 377/111; 377/121
[58] Field of Search ................ 377/79, 105, 121, 117, 377/111

[56] References Cited
U.S. PATENT DOCUMENTS

| | | | |
|---|---|---|---|
| 3,922,566 | 11/1975 | Kodama et al. | 377/121 |
| 4,025,800 | 5/1977 | Wanlass | 377/121 |
| 4,450,369 | 5/1984 | Schuermeyer | 377/121 |
| 4,741,005 | 4/1988 | Tanigawa | 377/105 |
| 4,951,303 | 8/1990 | Larson | 377/79 |

FOREIGN PATENT DOCUMENTS

| | | | |
|---|---|---|---|
| 0176218 | 8/1987 | Japan | 377/121 |
| 0142218 | 5/1990 | Japan | 377/121 |

OTHER PUBLICATIONS

"A 15GHz GaAs Dynamic Prescaler" by Kenji Fujita, Hiroshi Kumanoto, Hitoshi Itoh and Ryuitiro Yamamoto Compound Semiconductor Device Div., NEC Corporation Denki Tsushin Gakkai Ronbunshu ED 88-129, 1988.

Primary Examiner—John S. Heyman
Attorney, Agent, or Firm—Robert M. Asher; David G. Conlin

[57] ABSTRACT

An improved dynamic frequency divider circuit is disclosed. A DC voltage generating circuit (10) generates a DC voltage (Vcon) having a level the same as a threshold voltage of an inverter. A voltage application circuit (41) supplies a voltage (Vcon) to one electrode of a capacitor through a high frequency signal component cut-off coil (8), and a high frequency signal component is superimposed on the provided DC voltage. Accordingly, an input signal of an inverter (1a) swings around the threshold voltage level as a center, so that the inverter (1a) can provide a signal having the duty cycle of 50% as an output. As a result, the dynamic frequency divider circuit can be prevented from malfunctioning.

12 Claims, 6 Drawing Sheets

DYNAMIC FREQUENCY DIVIDER (SINGLE STAGE)

DYNAMIC FREQUENCY DIVIDER CIRCUIT WITH CAPACITOR IN LOOP TO ACHIEVE FIFTY PERCENT DUTY CYCLE OUTPUT

BACKGROUND OF THE INVENTION

1. Field of the Invention

The present invention generally relates to dynamic frequency divider circuits, and particularly to a dynamic frequency divider circuit using an inverter in it. The present invention has particular applicability to a phase-locked loop (PLL) circuit using a dynamic frequency divider operable in the microwave band.

2. Description of the Background Art

Generally, frequency dividers are widely used in various electric circuits for changing frequency of provided input signals into ones with lower frequency. For example, in phase-locked loop (hereinafter referred to as "PLL") circuits, frequency dividers are often used. PLL circuits including frequency dividers are also often used in communication apparatus and measuring apparatus operable in the microwave band. The PLL circuit will be briefly described as one example of application of frequency dividers.

Figure 1:
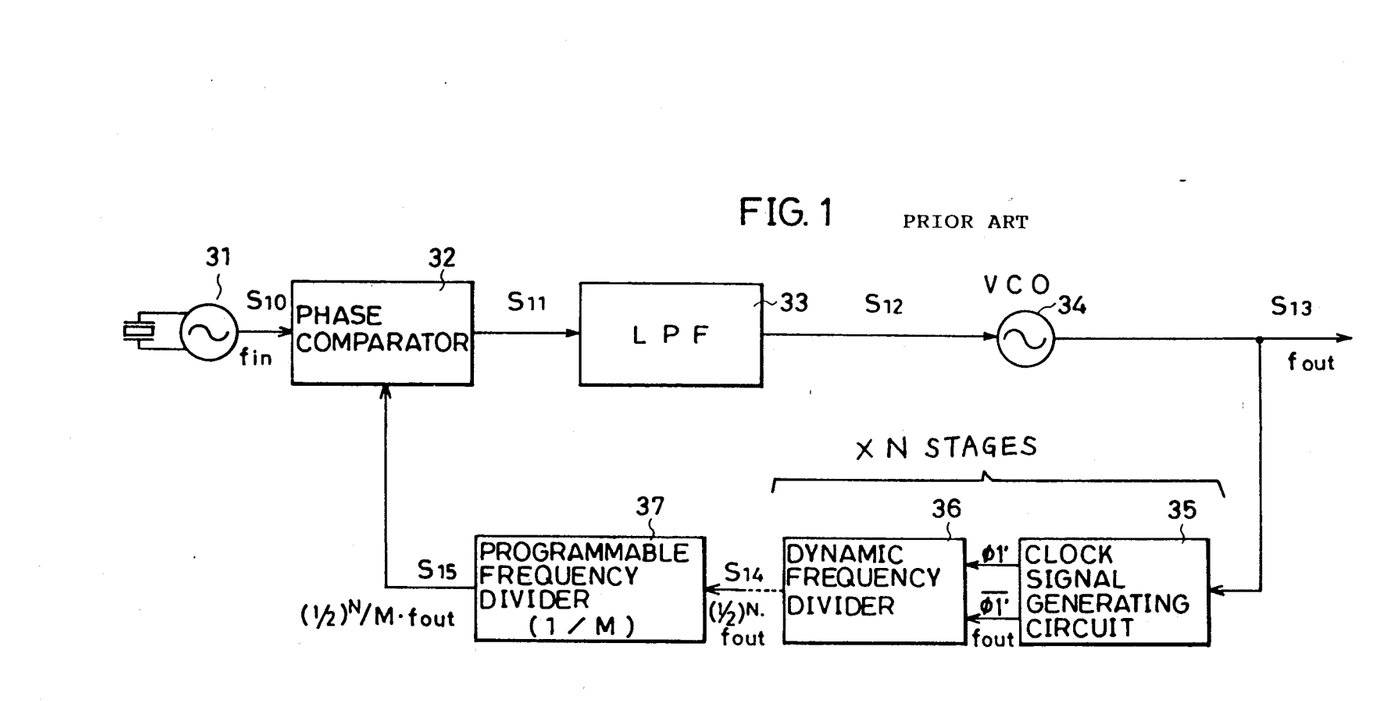
FIG. 1 is a block diagram of a PLL circuit.

FIG. 1 is a block diagram of a PLL circuit. Referring to FIG. 1, the PLL circuit includes a reference oscillator 31 for producing reference signals, a phase comparator 32, a low-pass filter (LPF) 33, a voltage control oscillator (VCO) 34, N stages of a clock signal generating circuit 35 and a dynamic frequency divider (or prescaler) 36, and a programmable frequency divider 37.

In operation, reference oscillator 31 produces a reference signal S10 having a frequency $f_{in}$, and provides it to phase comparator 32. Phase comparator 32 compares reference signal S10 and a signal S15 provided from programmable frequency divider 37 to produce a phase error signal S11. Phase error signal S11 is supplied to VCO 34 through LPF 33. An output signal S13 provided from VCO 34 has a frequency $f_{out}$, which is provided as an output signal of the PLL circuit, and also fed back to phase comparator 32 through circuits 35, 36 and 37.

Clock signal generating circuit 35 receives an output signal S13 from VCO 34, generates clock signals $\phi1'$ and $\overline{\phi1'}$ inverted with respect to each other, and provides them to dynamic frequency divider 36. The dynamic frequency divider 36 and the clock signal generating circuit 35 are cascaded for N stages. A single frequency divider circuit reduces the frequency of a provided clock signal to half. Accordingly, N stages of dynamic frequency dividers 36 provide a clock signal S14 having frequency $(\frac{1}{2})^N \cdot f_{out}$ as an output. Programmable frequency divider 37 divides the frequency of the supplied clock signal S14 to 1/M according to a program stored in advance. Accordingly, a clock signal S15 having a frequency $(\frac{1}{2})^N/M \cdot f_{out}$ is provided as an output from programmable frequency divider 37, which is supplied to phase comparator 32. Accordingly, the relationship between frequencies of two signals S10 and S15 supplied to phase comparator 32 is expressed as the following expression;

$$f_{in} = (\tfrac{1}{2})^N/M \cdot f_{out} \qquad (1).$$

For example, when an output signal S13 of $f_{out} = 15$ GHz is provided as an output from the PLL circuit, the dynamic frequency divider 36 is formed of $\frac{1}{2}$ frequency divider circuits of three stages (N=3) and the ratio of frequency division of programmable frequency divider 37 is set to 64 (M=64). Accordingly, the frequency of an output signal S14 of dynamic frequency divider 36 is 2.5 GHz and the frequency of an output signal S15 of programmable frequency divider 37 is 29.297 MHz. Accordingly, the reference oscillator 31 is required to generate a reference signal S10 of 29.297 MHz.

The PLL circuit includes dynamic frequency divider 36 having frequency divider circuits cascaded into N stages as described above, but one dynamic frequency divider circuit of a single stage will be described in the following description.

Figure 2:
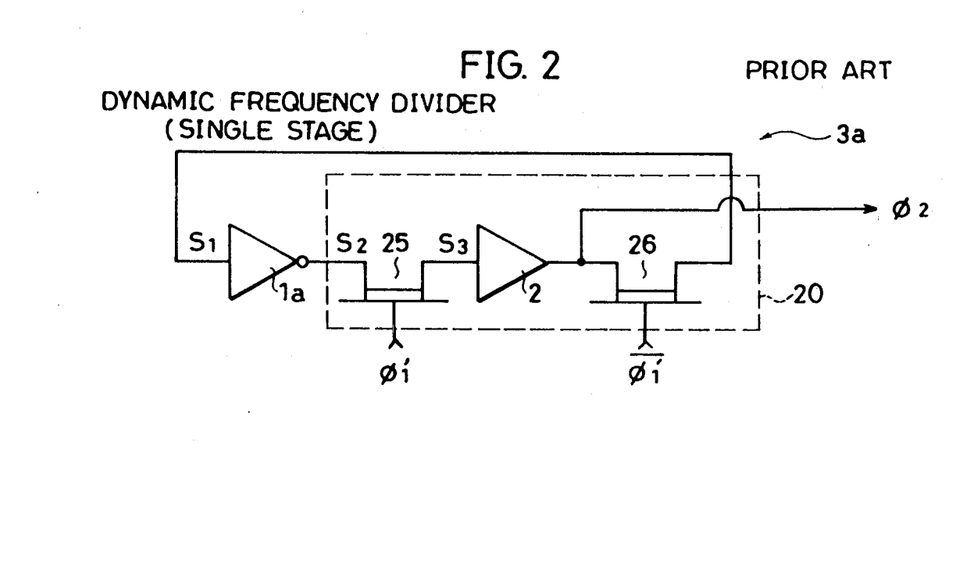
FIG. 2 is a circuit diagram of a dynamic frequency divider circuit employed in the PLL circuit shown in FIG. 1.

FIG. 2 is a circuit diagram of a dynamic frequency divider circuit 3a of a single stage. A circuit similar to the frequency divider circuit can be found in a thesis entitled "15 GHz GaAs dynamic prescaler" (Denki Tsushin Gakkai Ronbunshu, ED88-129, 1988).

Referring to FIG. 2, the frequency divider circuit 3a includes an inverter 1a formed of a buffered FET logic (BFL) circuit, depletion type MESFETs 25 and 26 which alternately turn on in response to input signals $\phi1'$ and $\overline{\phi1'}$, and a buffer 2 connected between MESFETs 25 and 26 for current amplification. One electrode of MESFET 26 is connected to an input of inverter 1a. In the following description, each MESFET 25 and 26 is referred to as "a transmission gate". A signal $\phi2$ having a frequency which is half of that of an input signal $\phi1'$ is provided as an output through a common connection node of buffer 2 and MESFET 26.

Next, operation of the dynamic frequency divider circuit 3a shown in FIG. 2 will be described. First, it is assumed that a signal S1 of a low level is applied to inverter 1a, and a signal $\phi1'$ of a low level and a signal $\overline{\phi1'}$ of a high level are applied to transmission gates 25 and 26. Accordingly, transmission gate 25 turns off and transmission gate 26 turns on. Buffer 2 provides an output signal $\phi2$ of a low level.

Next, when input signals $\phi1'$ and $\overline{\phi1'}$ turn into a high level and a low level, respectively, transmission gate 25 turns on and transmission gate 26 turns off. A signal S2 of a high level outputted from inverter 1a is provided to buffer 2 through transmission gate 25. Buffer 2 current-amplifies the provided signal S3 and holds the amplified signal. Accordingly, the level of the output signal $\phi2$ of buffer 2 changes from a low level to a high level. Transmission gate 26 is then OFF, so that a signal of a high level is not transmitted to inverter 1a.

Furthermore, when an input signal $\phi1'$ of a low level and an input signal $\overline{\phi1'}$ of a high level are provided, transmission gates 25 and 26 turn off and on, respectively. Accordingly, a high level signal outputted from buffer 2 is applied to inverter 1a through transmission gate 26, and an output signal S2 falls to a low level after a delay time by inverter 1a. Then, since transmission gate 25 has been already turned off, an output signal S2 of a low level is not transmitted to buffer 2. Accordingly, an output signal $\phi2$ is maintained at the high level.

Operation in the case where an input signal $\phi1$ changes in the order of "low level"—"high level"—"low level" has been described in the above description, and the dynamic frequency divider circuit 3a returns to the condition assumed first by repeating the signal cycle of an input signal $\phi1'$ once again. This means that frequency divider circuit 3a performs $\frac{1}{2}$ frequency dividing operation.

In the dynamic frequency divider circuit 3a shown in FIG. 2, the holding time of signal charge is determined with the gate capacitance and the wiring capacitance of a circuit connected to an output side of each transmission gate 25 and 26 and the leakage conductance thereof. In other words, the frequency divider circuit 3a performs "dynamic operation", and the lowest limit frequency at which the frequency divider circuit 3a is operable is determined on the basis of the length of the time in which the signal charge can be held.

Figure 9:
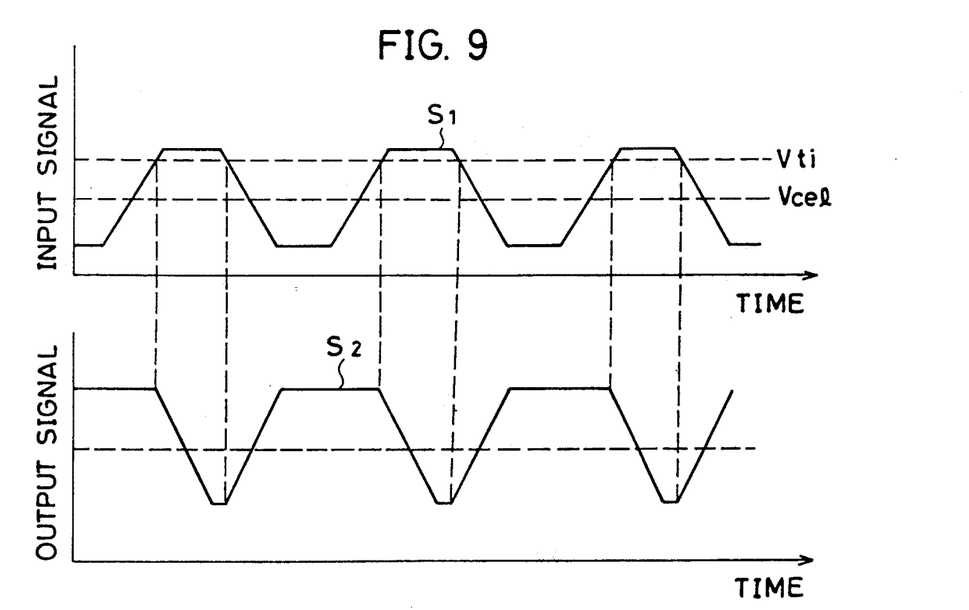
FIG. 9 is a waveform diagram of input/output signals of the inverter shown in FIG. 2.

Next, a problem which occurs in the frequency divider circuit 3a shown in FIG. 2 will be described. As seen from the above description, an output signal S2 of inverter 1a returns to an input of inverter 1a via a loop formed in frequency divider circuit 3a. That is to say, output signal S2 is returned to inverter 1a through transmission gate 25, buffer 2 and transmission gate 26, so that the direct current (hereinafter referred to as "DC") voltage of the returned signal S1 is shifted to the lower direction. This is because the gains of buffer 2 formed of a source follower circuit and transmission gates 25 and 26 are generally set 1.0 or lower. Accordingly, the DC voltage level of the signal S1 returned to inverter 1a, or the voltage level at the center of the swing of signal S1 becomes lower than the threshold voltage level of inverter 1a. That is, as shown in FIG. 9, since the center voltage level Vcel of the swing of the input signal S1 becomes lower than the threshold voltage level Vti of inverter 1a, inverter 1a provides the signal S2 shown in FIG. 9 as an output. The output signal S2 does not have a duty cycle of 50% as seen from FIG. 9. In other words, a change in the duty cycle is caused by inverter 1a. As a result, a malfunction is caused in frequency divider circuit 3a. As a result, for example, the PLL circuit shown in FIG. 1 does not operate normally.

Figure 3:
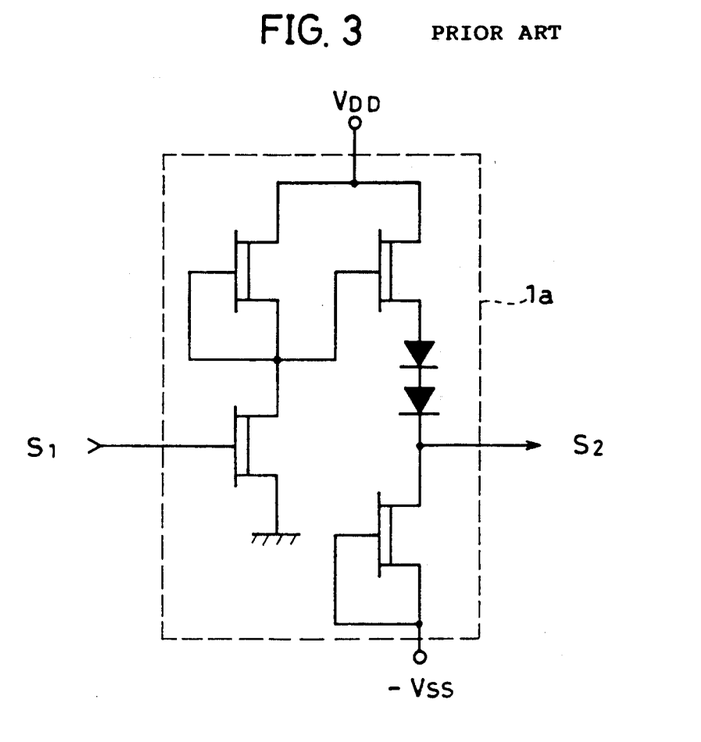
FIG. 3 is a circuit diagram of the inverter shown in FIG. 2.

In addition to the above-stated problem, it is pointed out that a problem as described below is caused in the frequency divider circuit 3a shown in FIG. 2. FIG. 3 is a circuit diagram of inverter 1a shown in FIG. 2. Inverter 1a is formed of a buffered FET logic (BFL) circuit, which includes MESFETs operating in the depletion mode. The MESFETs have negative threshold voltage Vth. MESFETs 25 and 26 in the frequency divider circuit 3a shown in FIG. 2 also have threshold voltage Vth of the same value. Accordingly, the voltage level of a high frequency signal transmitted through transmission gate 25 or 26 is shifted by the voltage value of the threshold voltage Vth. Accordingly, the DC voltage level of the input signal $\phi1'$ supplied to the gate of transmission gate 25 should be set to be lower than the DC voltage level of an input signal S2 of inverter 1a by $|Vth|$. Similarly, the clock signal $\overline{\phi1'}$ supplied to the gate of transmission gate 26 should be also set to be lower than the DC voltage level of the output signal $\phi2$ by $|Vth|$.

Figure 4:
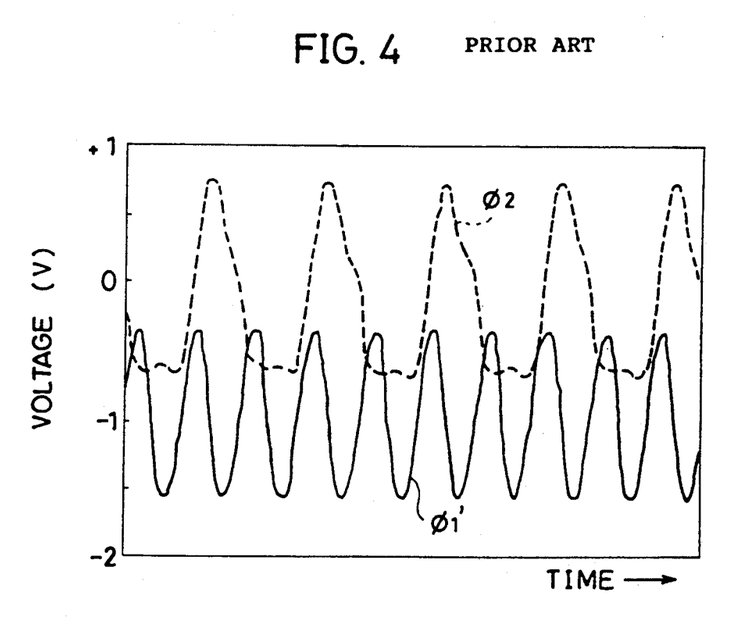
FIG. 4 is a waveform diagram of input/output signals of the dynamic frequency divider circuit shown in FIG. 2.

FIG. 4 is a waveform diagram of an input/output signals of the dynamic frequency divider shown in FIG. 2. In other words, in order to provide an output signal $\phi2$ which swings about the DC voltage level of 0 volt, it is required to supply an input signal $\phi1'$ which swings about that DC voltage level lower than the DC voltage level by about $|Vth|$. That is to say, in the example shown in FIG. 4, since the frequency of input signal $\phi1'$ is 5 GHz and Vth = −0.8 volt, an input signal $\phi1'$ which swings with a center DC voltage level of −0.8 volt is supplied. As a DC voltage level difference is needed between the input signal $\phi1'$ and the output signal $\phi2$, it is not preferable in view of matching of input/output signals to connect frequency divider circuits over a plurality of stages. For example, in the PLL circuit (FIG. 1) having frequency divider circuit 36 cascaded for N stages, a malfunction may occur.

SUMMARY OF THE INVENTION

It is an object of the present invention to prevent malfunctions in a frequency divider circuit.

It is another object of the present invention to adjust the duty cycle of an output signal of an inverter to 50% in a frequency divider circuit having an inverter.

It is yet another object of the present invention to prevent a PLL circuit employing a frequency divider from malfunctioning.

Briefly stated, a frequency divider circuit according to the present invention includes a first and a second switching elements which are alternately turned on in response to input clock signals, a voltage holding circuit connected between the first and second switching elements for holding a voltage supplied through the first switching element, and an inverter coupled to receive an output signal provided from the voltage holding circuit through the second switching element. The inverter has its output connected to the voltage holding circuit through the first switching element. The frequency divider circuit includes a DC voltage level control circuit connected between an output of the second switching element and an input of the inverter for controlling the DC voltage level of an output signal provided from the second switching element to a predetermined level.

In operation, the DC voltage level of a signal supplied to the inverter is controlled by the DC voltage level control circuit, so that the duty cycle of an output signal of the inverter can be controlled. Accordingly, occurrence of malfunctions in the frequency divider circuit can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
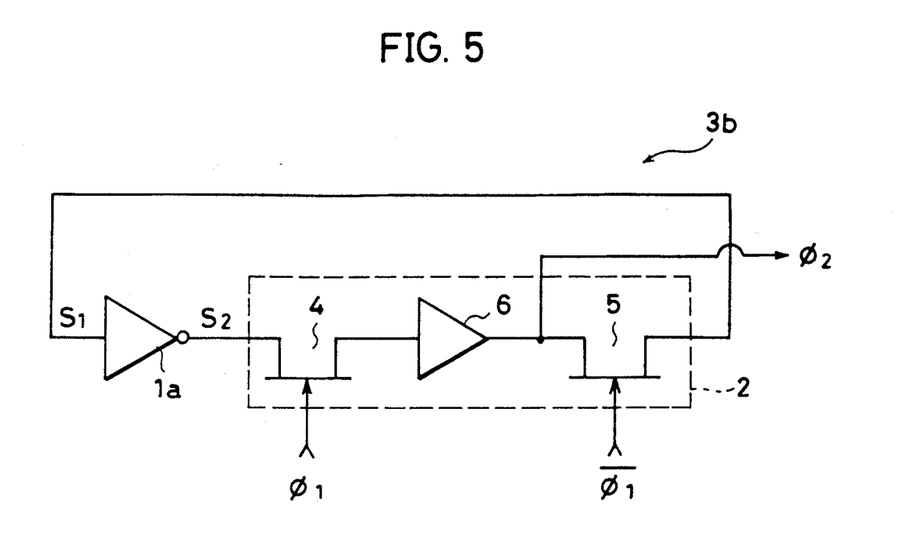
FIG. 5 is a circuit diagram of a dynamic frequency divider showing one embodiment of the present invention.
Figure 6:
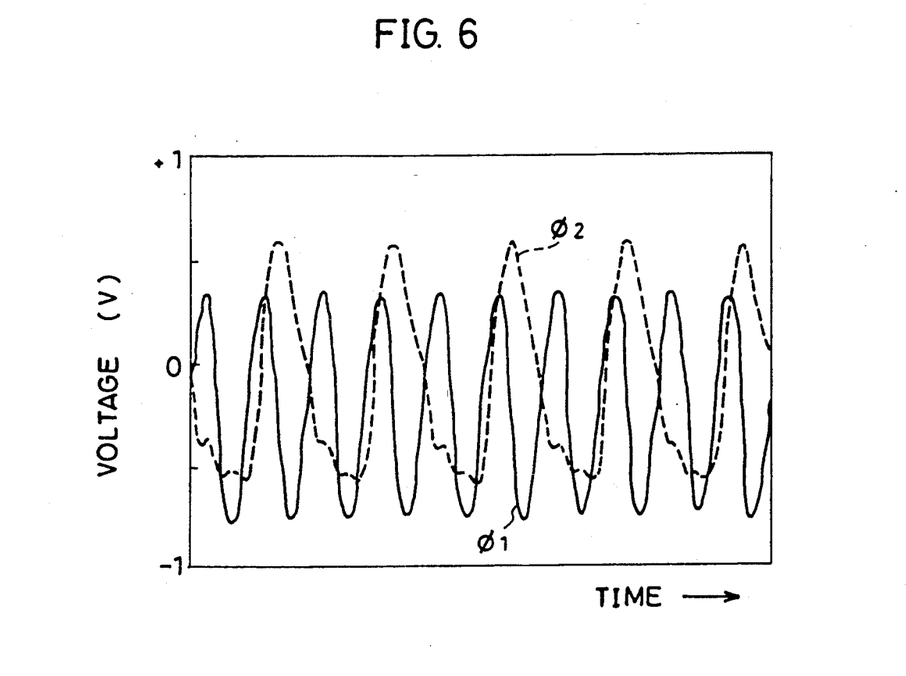
FIG. 6 is a waveform diagram of input/output signals of the dynamic frequency divider circuit shown in FIG. 5.

Referring to FIG. 5, a dynamic frequency divider circuit 3b showing one embodiment of the present invention is shown. The circuit configuration of the inverter 1a is the same as that shown in FIG. 3. That is to say, the threshold voltage Vth of MESFETs used therein is set to −0.8 volt. On the other hand, the threshold voltage Vth' of MESFETs 4 and 5 operating as transmission gates is set to 0 volt. That is to say, as compared to the conventional frequency divider circuit 3a shown in FIG. 2, the frequency divider circuit 3b shown in FIG. 5 employs enhancement type MESFETs 4 and 5 instead of depletion type MESFETs 25 and 26. Accordingly, the DC voltage level of an output signal S2 of inverter 1a and the DC voltage level of an input signal $\phi 1$ can be matched. In addition to this, the DC voltage level of an output signal $\phi 2$ of buffer 6 and the DC voltage level of an input signal $\phi 1$ can be made coincided with each other. As a result, as shown in FIG. 6, the DC voltage level difference between the input signal $\phi 1$ and the output signal $\phi 2$ is reduced, so that the problem about matching in cascading the frequency divider circuit 3b shown in FIG. 5 over a plurality of stages can be solved.

Figure 7:
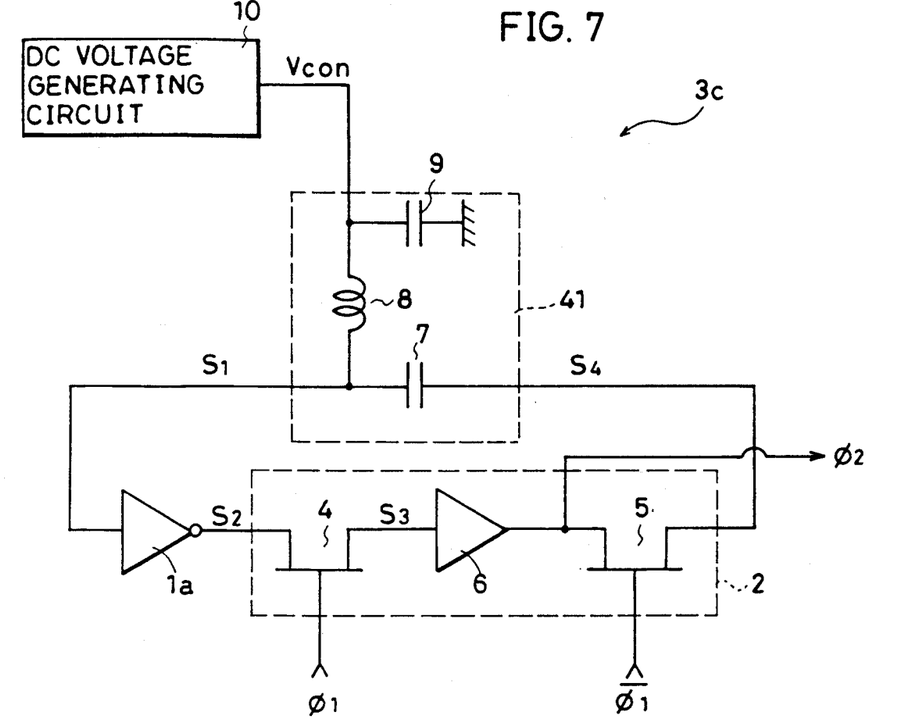
FIG. 7 is a circuit diagram of a dynamic frequency divider circuit showing another embodiment of the present invention.

Referring to FIG. 7, a dynamic frequency divider circuit 3c showing another embodiment of the present invention is shown. The frequency divider circuit 3c, as compared to the frequency divider circuit 3b shown in FIG. 5, includes a DC voltage generating circuit 10 for generating a control voltage Vcon for controlling the duty cycle of the signal S2 and a DC voltage application circuit 41 for applying the voltage Vcon, in addition. DC voltage generating circuit 10 generates a DC voltage Vcon with the same value as that of the threshold voltage of inverter 1a. The voltage application circuit 41 receives the voltage Vcon and supplies it to an input of inverter 1a as DC bias voltage.

Voltage application circuit 41 includes a DC signal component cut-off capacitor 7 connected between transmission gate 5 and inverter 1a, a high frequency signal component cut-off coil 8 and a capacitor 9 for supplying high frequency signal components to ground. In operation, a signal supplied from buffer 6 as an output is supplied to one electrode of capacitor 7 as a signal S4 through transmission gate 5. The signal S4 includes a high frequency signal component and a DC voltage component, in which the high frequency signal component only is passed by capacitor 7. The DC voltage Vcon generated from DC voltage generating circuit 10 is supplied to the other electrode of capacitor 7 through coil 8. Accordingly, the high frequency signal component passed through capacitor 7 is superimposed on the provided DC voltage Vcon, and the overlapped signal S1 is supplied to inverter 1a. Coil 8 prevents the high frequency signal component to be transmitted to DC voltage generating circuit 10. Even if the high frequency signal component passes through coil 8, the high frequency signal component is provided to ground through capacitor 9.

Figure 8:
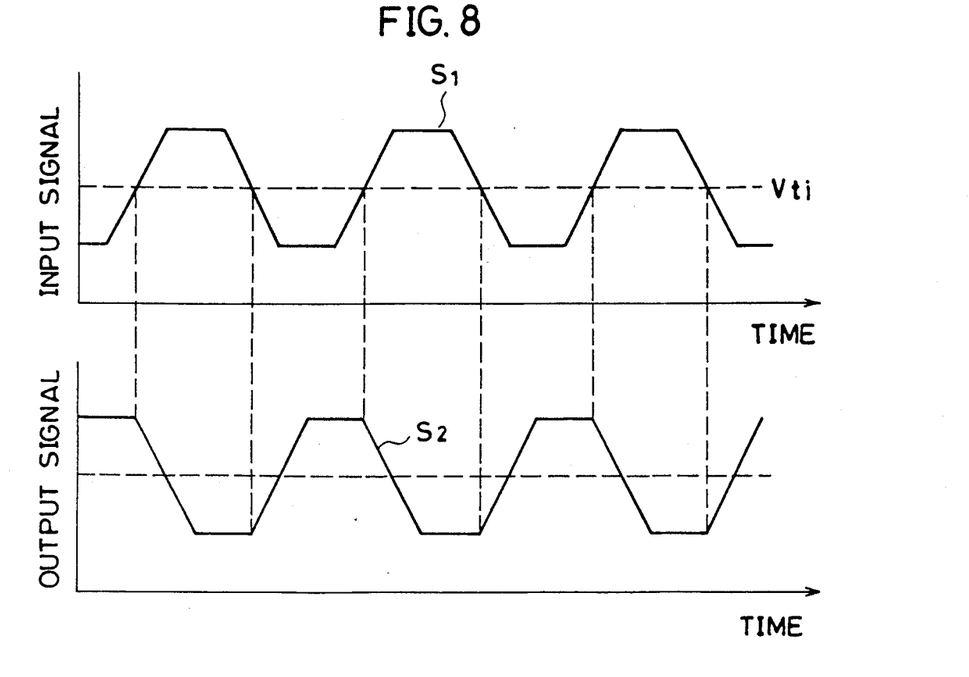
FIG. 8 is a waveform diagram of input/output signals of the inverter shown in FIG. 7.

Accordingly, as shown in FIG. 8, an input signal S1 of inverter 1 swings about the threshold voltage level Vti of inverter 1a, so that a signal S2 having duty cycle of 50% can be provided as an output by inverter 1a. As a result, occurrence of malfunctions in the frequency divider circuit 3c shown in FIG. 7 can be prevented. That is, in the conventional frequency divider circuit 3a shown in FIG. 2, as shown in FIG. 9, a signal S2 having duty cycle of 50% can not be obtained, so that the average voltage level is shifted to the lower side to cause malfunctions. On the other hand, in the frequency divider circuit 3c shown in FIG. 7, by controlling a value of the voltage Vcon generated from DC voltage generating circuit 10, the duty cycle of the signal S2 can be adjusted to 50%. Accordingly, the average voltage level can be maintained constant to prevent malfunction occurrence.

Figure 10:
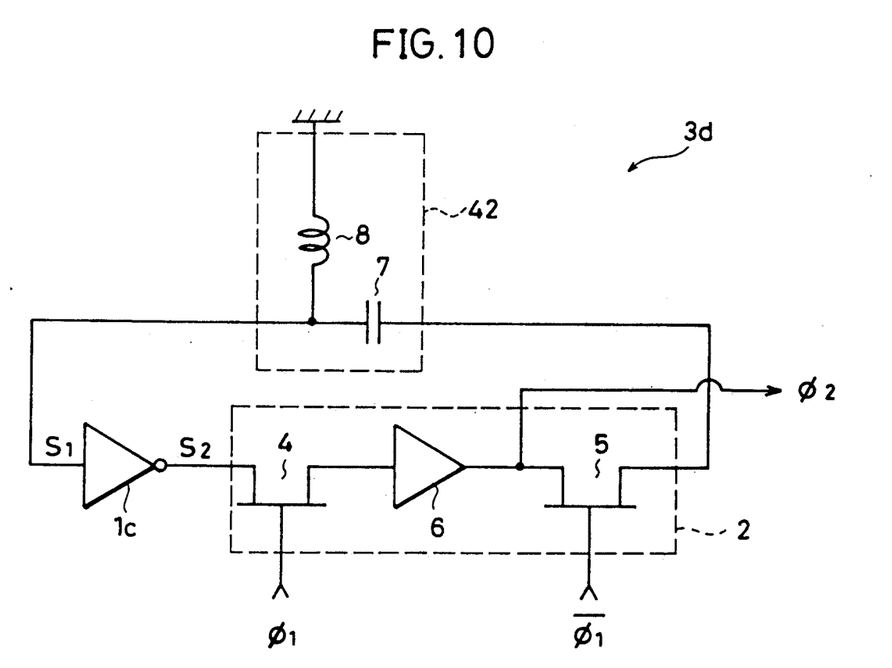
FIG. 10 is a circuit diagram of a dynamic frequency divider circuit showing still another embodiment of the present invention.
Figure 11:
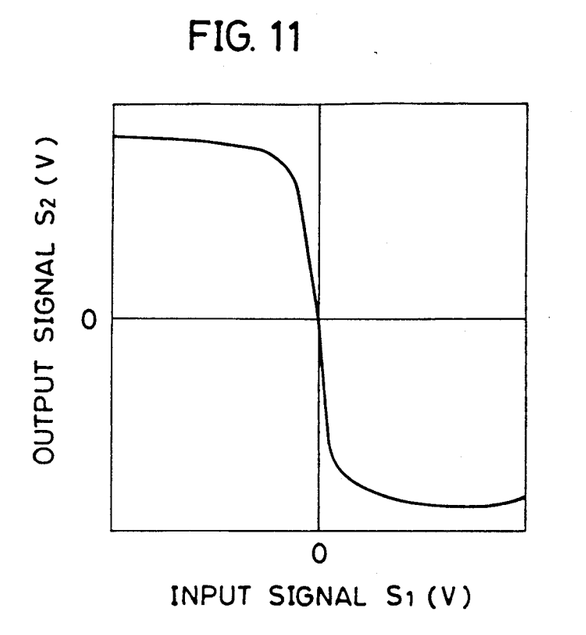
FIG. 11 is a characteristic diagram of the inverter shown in FIG. 10.

Referring to FIG. 10, a dynamic frequency divider circuit 3d indicating yet another embodiment of the present invention is shown. Instead of the voltage application circuit 41 shown in FIG. 7, another voltage application circuit 42 is provided in the frequency divider circuit 3d. In addition, the threshold voltage of inverter 1c is set to 0 volt. The voltage application circuit 42 includes a DC signal component cut-off capacitor 7 connected between transmission gate 5 and inverter 1c and a high frequency signal component cut-off coil 8 connected between the other electrode of a capacitor 7 and ground. Inverter 1c has input/output characteristics as shown in FIG. 11.

In operation, the high frequency signal component transmitted through capacitor 7 is superimposed on the DC voltage supplied through coil 8. Accordingly, the superimposed signal S1 swings around the center of the voltage level of 0 volt, so that inverter 1c can provide as an output a signal S2 having the duty cycle of 50%. In this embodiment, the threshold voltage of inverter 1c is set to 0 volt, so that such a DC voltage generating circuit 10 as shown in FIG. 7 is not needed, resulting in simplifying the circuit configuration as compared to the circuit shown in FIG. 7.

Figure 12:
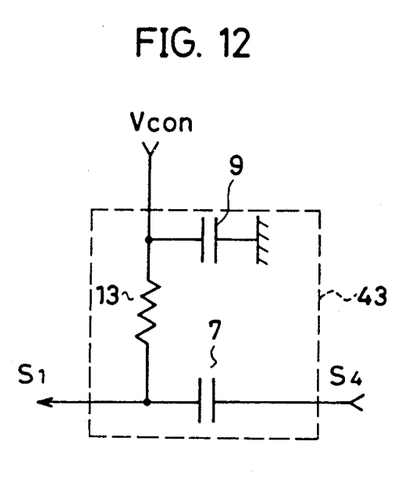
FIG. 12 is a circuit diagram of a voltage application circuit showing yet another embodiment of the present invention.
Figure 13:
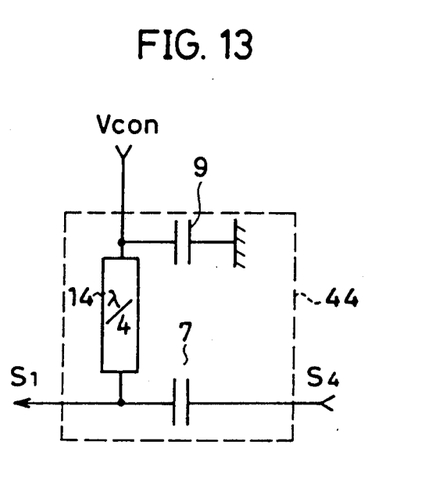
FIG. 13 is a circuit diagram of a voltage application circuit showing further embodiment of the present invention.

In FIGS. 12 and 13, still another embodiments of the present invention are shown. Voltage holding circuits 43 and 44 shown in FIGS. 12 and 13 can be applied instead of the voltage application circuit 41 shown in FIG. 7. Instead of the coil 8 shown in FIG. 7, a resistor 13 is provided in voltage holding circuit 43. Resistor 13 can be easily formed in a semiconductor substrate, which enables a frequency divider circuit to be formed in a single substrate.

In a voltage application circuit 44 shown in FIG. 13, instead of the coil 8 shown in FIG. 7, a short stub 14 having a length of one fourth ($\lambda/4$) of the wavelength of the signal S1 is provided. Short stub 14 selectively cuts off high frequency signal S1 only. Accordingly, a frequency divider circuit can be formed in a single semiconductor substrate, which is also advantageous in highly integrating circuits.

As described above, in the dynamic frequency divider circuit 3b shown in FIG. 5, the DC voltage level difference between the input clock signal $\phi 1$ and the output clock signal $\phi 2$ is reduced, so that a problem in matching can be prevented from occurring when cascading the frequency divider circuits 3b into a plurality of stages. In addition, in frequency divider circuits 3c and 3d shown in FIGS. 7 and 10, the duty cycle of output signal S2 of inverters 1a and 1c are maintained at 50%, which prevents malfunction occurrence. By cascading these frequency divider circuits 3b, 3c or 3d over a plurality of stages, and employing it as a dynamic frequency divider 36 of the PLL circuit shown in FIG. 1, for example, a PLL circuit stably operating can be obtained. It is also pointed out that generally the frequency divider circuits 3b, 3c and 3d are widely applicable in various electric circuits not only in a PLL circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency divider circuit for dividing an applied input signal, comprising:

first and second switching means responsive to the input signal to be alternately turned on;
voltage holding means connected between said first and second switching means for holding voltage applied through said first switching means;
DC voltage generating means for generating a DC voltage having a predetermined level;
superimposing means for superimposing an output signal provided from said voltage holding means through said second switching means on the DC voltage generated from said DC voltage generating means, said superimposing means including:
  AC signal component selectively passing means connected to an output of said second switching means for selectively passing AC signal component included in the output signal of said second switching means, said AC signal component selectively passing means having an output, and
  DC voltage selectively passing means connected to said DC voltage generating means for selectively passing DC voltage generated from said DC voltage generating means, said DC voltage selectively passing means having an output; and
inverter means having an input for receiving an output signal from aid superimposing means provided from the output of said AC signal component selectively passing means and from the output of said DC voltage selectively passing means and said inverter means having an output coupled to said voltage means through said first switching means.

2. The frequency divider circuit according to claim 1, wherein said predetermined DC voltage level is set to a threshold voltage level of said inverter means.

3. The frequency divider circuit according to claim 1, wherein said AC signal component selectively passing means includes capacitor means connected between the output of said second switching means and the input of said inverter means.

4. The frequency divider circuit according to claim 1, wherein said DC voltage selectively passing means comprises inductor means connected between said DC voltage generating means and the output of said AC signal component selectively passing means.

5. The frequency divider circuit according to claim 1, wherein
said input signal comprises a first and a second input signals inverted with respect to each other,
said first switching means comprises a first field effect transistor connected between the output of said inverter means and an input of said voltage holding means operated in response to the first input signal, and
said second switching means includes a second field effect transistor connected between an output of said voltage holding means and the input of said inverter means for being operated in response to the second input signal.

6. The frequency divider circuit according to claim 1, wherein said voltage holding means comprises current amplifying means connected between said first and second switching means.

7. The frequency divider circuit according to claim 5, wherein
said first and second input signals swing about the threshold voltage level of said inverter means as a center,
said first field effect transistor has a gate connected to receive said first input signal, and
said second field effect transistor has a gate connected to receive said second input signal.

8. The frequency divider circuit according to claim 1, wherein said DC voltage selectively passing means comprises a stub line having a length of one fourth of the wavelength of said input signal connected between said DC voltage generating means and the output of said AC signal component selectively passing means.

9. The frequency divider circuit according to claim 1, wherein said DC voltage selectively passing means comprises resistor means connected between said DC voltage generating means and the output of said AC signal component selectively passing means.

10. The frequency divider circuit according to claim 1, wherein said DC voltage generating means generates a DC voltage having a ground potential level.

11. The frequency divider circuit according to claim 1, wherein said DC voltage selectively passing means comprises AC signal component absorbing means connected to the output of said DC voltage generating means for supplying AC signal components to ground.

12. The frequency divider circuit according to claim 11, wherein said AC signal component absorbing means comprises second capacitor means connected between the output of said DC voltage generating means and ground.

* * * * *